United States Patent [19]

Mattausch

[11] Patent Number: 4,860,263

[45] Date of Patent: Aug. 22, 1989

[54] SEMICONDUCTOR MEMORY WITH RANDOM ACCESS VIA TWO SEPARATE INPUTS/OUTPUTS

[75] Inventor: Hans J. Mattausch, Kirchheim, Fed. Rep. of Germany

[73] Assignee: Siemens Aktiengesellschaft, Berlin and Munich, Fed. Rep. of Germany

[21] Appl. No.: 147,451

[22] Filed: Jan. 25, 1988

[30] Foreign Application Priority Data

Jan. 23, 1987 [DE] Fed. Rep. of Germany ....... 3701976

[51] Int. Cl.$^4$ .............................................. G11C 8/00
[52] U.S. Cl. ............................... 365/230.05; 365/203; 365/189.04
[58] Field of Search ................. 365/189, 203, 230, 233

[56] References Cited

U.S. PATENT DOCUMENTS

| | | | |
|---|---|---|---|
| 4,541,076 | 9/1985 | Bowers et al. ................. | 365/189 X |
| 4,623,990 | 11/1986 | Allen et al. ........................ | 365/189 |
| 4,633,441 | 12/1986 | Ishimoto ............................ | 365/189 |

OTHER PUBLICATIONS

IEEE Conference on Custom Integrated Circuits, Sep. 1982, pp. 311-314, S. G. Bowers, "CMOS Dual Port RAM Masterslice".

Primary Examiner—Joseph A. Popek
Attorney, Agent, or Firm—Hill, Van Santen, Steadman & Simpson

[57] ABSTRACT

In a dual port RAM having separate address controls, write/read paths and pre-loading circuits for each of the two input/output terminals, conflict situations are avoided when addressing a memory cell via the address controls of both input/outputs, through use of a clock circuit (20) which respectively alternately selects the address controls (8, 10, 9, 11) and the pre-loading circuits (16, 17) so that the address control (8, 10) for the first input/output (DEA1) and the pre-loading circuit (17) for the data lines (LP$_{P2}$) allocated to the second input/output (DEA2) are activated during a first clock phase, and the address control (9, 11) of the second input/output (DEA2) and the data lines (LP$_{P1}$) allocated to the first input/output (DEA1) are activated during a second clock phase.

5 Claims, 3 Drawing Sheets

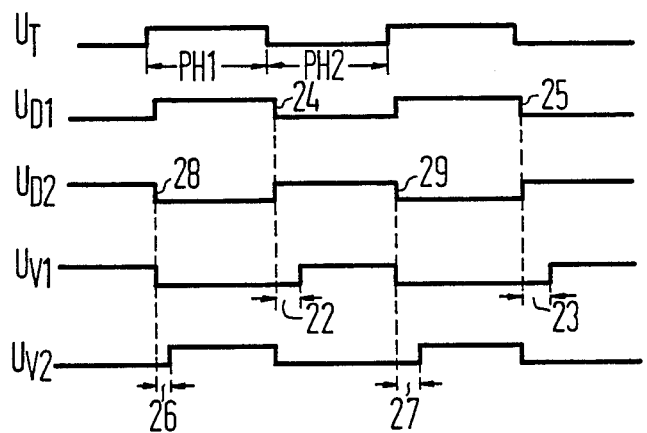
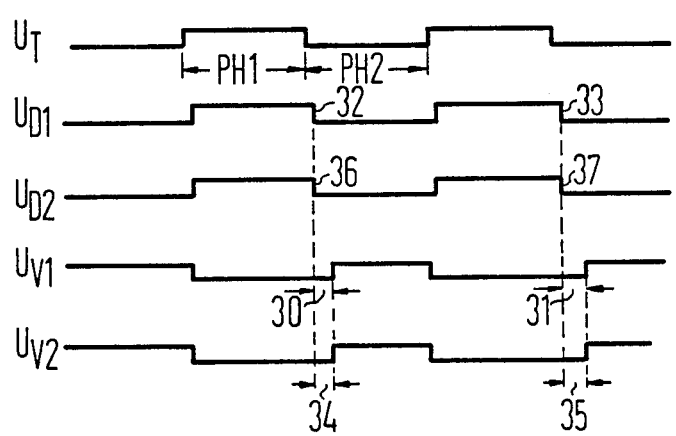

SEMICONDUCTOR MEMORY WITH RANDOM ACCESS VIA TWO SEPARATE INPUTS/OUTPUTS

BACKGROUND OF THE INVENTION

The invention is directed to a random access semiconductor memory having two separate inputs/outputs.

Such a memory, which is also referred to as "dual-port-RAM", is know from the conference volume of the IEEE Custom Integrated Circuits Conference, September 1982, Pages 311–314. During operation of such a memory, conflict situations are possible, such as, for example, when two different signals are to be written into a memory cell simultaneously addressed via both inputs/outputs, in which case an uncontrollable signal would then be written in. In order to prevent this, logic circuits must be provided which prevent a simultaneous addressing of the same memory cell via both inputs/outputs.

SUMMARY OF THE INVENTION

The object of the invention is to specify such a semiconductor memory wherein such conflict situations can be reliably avoided. This is achieved in the present invention by fashioning the semiconductor memory with two separate address controls and two separate preloading circuits, and clocking them during separate clock phases.

The advantage obtainable with the invention is that the address controls for the inputs/outputs are selectable via a clock circuit and that all memory cells can be addressed without limitation via both input/outputs and can be charged with signals to be written in or can be read out without conflict. Semiconductor memories constructed in accordance with the present invention, having systems operating in this mode, are advantageous in multi-processor systems.

Brief Description of the Drawings

The invention shall be set forth in greater detail below with reference to a preferred exemplary embodiment shown in the drawing, in which:

FIGS. 3 and 4 show voltage-time diagrams for explaining FIG. 1; and

DESCRIPTION OF THE PREFERRED EMBODIMENT

Figure 1:
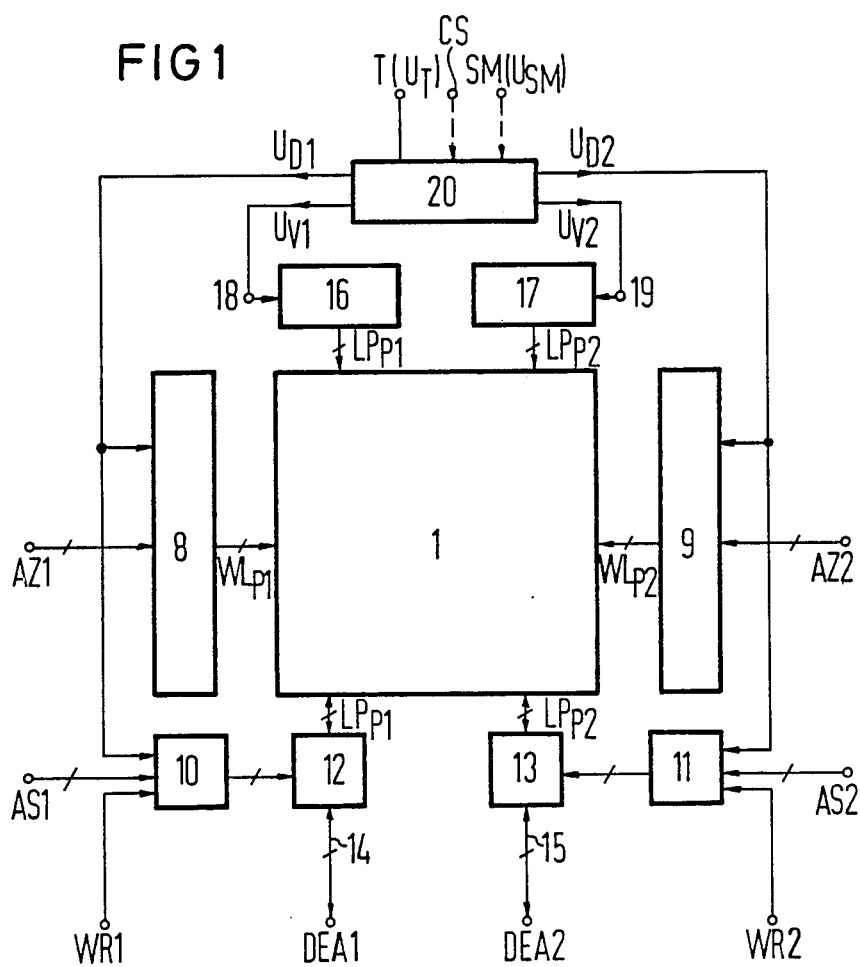
FIG. 1 shows a block circuit diagram of a semiconductor memory fashioned in accord with the present invention.

In FIG. 1, a main memory area is shown, which is constructed of a plurality of, for example, static memory cells in complementary circuit technology. The cells are fashioned in accord with FIG. 2, in which each of these memory cells comprises tow cross-coupled inverters, of which the first is composed of the series circuit of two field effect transistors T1 and T2, the second being composed of the series circuit of two field effect transistors T3 and T4. The source terminals of the p-channel transistors T1 and T3 are connected to a terminal 2 which is wired with a supply voltage of, for example, 5 volts. The source terminals of the n-channel transistors T2 and T4 are connected to a terminal 3 which is wired with a reference potential. The drain terminals of T1 and T2 are connected to one another at a node 4; the gate terminals of these transistors are connected to one another at a node 5. For realizing the cross-coupling, the drain terminals of T3 and T4 are likewise connected to one another at the node 5 and the gate terminals of T3 and T4 are connected to one another at the node 4. The nodes 4 and 5 are each connected to data lines L1 and L1' via the source-drain paths of n-channel selection transistors T5 and T6 and are also connected to data lines L2 and L2' via the source-drain paths of n-channel selection transistors T8 and T7. The gates of T5 and T6 are selected via a word line WL1; the gates of T7 and T8 are selected via a word line WL2.

The memory cells are combined in the main memory area 1 by rows and columns, namely such that all memory cells of a row are connected to shared word lines WL1 and W2, whereas all memory cells of a column are connected to shared data line pairs L1, L1' and L2, L2'. The word lines W1 of all rows of the main memory area 1 are referenced $WL_{p1}$ in FIG. 1; the word lines W2 of all rows are referenced $WL_{p2}$ therein. The data line pairs L1, L1' of all columns of the main memory area are referenced $LP_{p1}$; the data line pairs L2, L2' of all columns are referenced $LP_{p2}$. DEA1 indicates a first input/output for data and DEA 2 references a second. A block 8 represents the row decoding for DEA1; a block 9 represents the row decoding for DEA2. The column decodings for DEA1 and DEA2 are each referenced 10 and 11. The block 12 contains a read amplifier and a write circuit which are selectively connectible to a data line pair L1, L1' selected via the column decoding 10. Analogously thereto, a further block 13 contains a read amplifier and a write circuit which can be selectively connected to a data line pair L2, L2' selected via the column decoding 11. The input of the write circuit of 12, just like the output of the read amplifier of the same block, is connected to DEA1 via an input/output line 14; the input of the write circuit as well as the output of the read amplifier of the block 13 are connected to DEA2 via an input/output line 15. Given an incomplete column decoding DEA1, DEA2 can each also be composed of a plurality of input/output comprising corresponding input/output lines 14, 15. The blocks 12, 13 must then correspondingly contain a plurality of read amplifiers and write circuits.

When addressing a memory cell for the purpose of writing a signal in or reading a signal out via DEA1, an address signal supplied to the input AZ1 of the row decoder 8 effects selection of a specific word line WL1 from the work lines $WL_{p1}$. Further, an address signal supplied to the input AS1 of the column decoder 8 selects a specific pair L1, L1' from the data line pairs $LP_{p1}$. Finally, the input WR1 of the block 10 is supplied with a signal which initiates the connection of the read amplifier or of the write circuit in the block 12 to the selected data line pair. In the same fashion, the addressing of a memory cell for the purpose of writing a signal in or reading a signal out via DEA2 takes place with the assistance of address signals which are supplied to the inputs EZ2 of new decoder 9 and EZ2 of column decoder 11 and with the assistance of a signal supplied to the input WR2 which initiates the connection of the read amplifier or of the write circuit in the block 13 to the selected data line pair L2, L2'.

Figure 2:
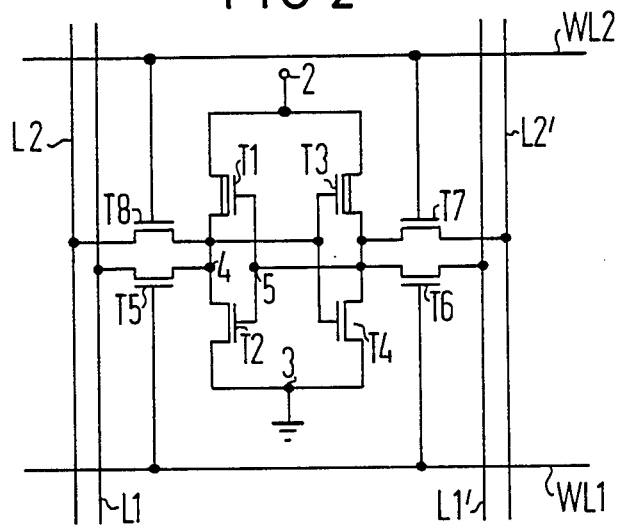
FIG. 2 shows the fundamental circuit of a memory cell of the semiconductor memory of FIG. 1.

Given to read-out or write-in operation for a memory cell according to FIG. 2, either one or both of the word lines W1 and WL2 can be simultaneously addressed, so that either one of the data line pairs, for example, L1 and L1', or both data line pairs L1, L1' and L2, L2' are connected to the internal nodes 4, 5 of the memory cell via the transistors T5, T6, or, respectively, T8, T7. When both word lines are simultaneously addressed, then the afore-mentioned conflict can occur when writing signals.

Before the read-out of a stored signal, all data line pairs $LP_{p1}$ or, respectively, $LP_{p2}$ are charged with a prescribed potential, for the data line pairs $LP_{p1}$ via a pre-loading circuit 16 and via a pre-loading circuit 17 for the data line pairs $LP_{p2}$. These pre-loading circuits, for example, contain p-channel transistors whose drain terminals are connected to the individual data lines, whereas their source terminals are wired to the supply voltage. The control terminals of the p-channel transistors of the preloading circuit 16 are connected to an input 18; the control terminals of the p-channel transistors of the pre-loading circuit 17 are connected to an input 19.

It is adequate for explaining the read-out operation to consider a data line pair, for example L1 and L1', given an addressed word line WL1. Let L1, L1' be pre-loaded by being connected to the supply voltage by the pre-loading circuit. Given a stored "1", the nodes 4 lie, for example, at the supply voltage and the nodes 5 lie at the reference potential. The read-out of the stored "1" is then executed such that the data line L1' is discharged to the reference potential via the transistor T6, whereas the data line L1 remains at the supply voltage. The arising difference signal is interpreted as "1" via read amplifier of the block 12 and is output at the input/output DEA1. When writing a "0" in via the input/output DEA1, the selected line pair L1, L1' is charged via the write circuit of the block 12 such that L1 is connected to the reference potential and L1' is wired to the supply voltage. The potentials at L1 and L1' are then transferred onto the nodes 4 and 5 of the memory cell via the transistors T5 and T6. The read-out and write-in of signals given an addressed word line WL2 is executed correspondingly via the data line pair L2, L2', the block 13 and the input/output for data referenced DEA2.

A clock circuit 20 whose input T is occupied with an external voltage $U_T$ serves the purpose of deriving internal clock voltages $U_{D1}$, $U_{V1}$, $U_{D2}$ and $U_{V2}$ from $U_T$. $U_{D1}$ thereby initiates an activation of the row decoding 8 and of the column decoding 10, i.e. of the address control for the input/output DEA1, whereas $U_{V1}$ activates the pre-loading circuit 16 via its input 18. On the other hand, $U_{D2}$ initiates an activation of the line decoding 9 and of the column decoding 11, i.e. of the address control for the input/output DEA2, and $U_{V2}$ activates the pre-loading circuit 17 via its input 19.

The waveforms of the said clock voltages which respectively alternate between a lower voltage value corresponding to the reference voltage and an upper voltage value corresponding to the supply voltage are shown in Fig. 3. The pre-loading circuits 16 and 17 are respectively activated during the appearance of the upper voltage values of $U_{V1}$ and $U_{V2}$ whereas the address controls for the input/output DEA1 and DEA2 are respectively activated during the appearance of the upper voltage values of $U_{D1}$ and $U_{D2}$.

Expediently, every rise of the clock voltage $U_{V1}$ from its lower to its upper voltage value, whereby the pre-loading circuit 16 is activated, is delayed by a time span indicated by the double arrows 22 and 23 in comparison to the preceding trailing edges 24 and 25 of $U_{D1}$ with which the address control for DEA1 is deactivated. The corresponding voltage rises at $U_{V2}$ occur delayed by the time spans indicated by the double arrows 26 and 27 relative to the trailing edges 28 and 29 of $U_{D2}$. It is assured, as a result thereof, that the address control for an input/output, for example DEA1, is deactivated before the beginning of preloading or biasing of the data line pairs, for example, $LP_{p1}$, allocated to this output.

An alternating selection of the address controls for DEA1 and DEA2 and of the pre-loading circuits 16 and 17 takes place in response to the basis of the clock control according to FIG. 3, whereby the address control 8 and 10 for DEA1 as well as the pre-loading circuit 17 are activated in a first clock phase PH1 of $U_T$, whereas the address control 9 and 11 for DEA2 as well as the pre-loading circuit 16 are activated during a second clock phase PH2. Both clock phases augment one another to form a complete clock period of $U_T$. Given this operating mode of the circuit, the address control of the one input/output, for example, DEA1, is respectively activated, whereas the data line pairs, for example $LP_{p2}$, of the other input/output, for example, DEA2, are pre-loaded. The conflict situations cited at the outset which must be prevented by logic circuits in the traditional dual-port RAMs can thus no longer occur.

According to a development of the invention, the clock circuit 20 can also be fashioned such that it is selectively switchable to a different operating mode, so that clock control of the address controls and of the pre-loading circuits takes place in accord with FIG. 4. To this end, for example, an input SM of the clock circuit 20 is occupied with a signal $U_{SM}$ which guarantees an operating mode according to FIG. 3. When $U_{SM}$ is disconnected, then the clock circuit 20 operates in an operating mode according to FIG. 4. The time dependencies of the internal clock voltages $U_{D1}$, $U_{D2}$, $U_{V1}$, and $U_{V2}$ occuring in the latter instance are again shown under the external clock voltage $U_T$. As may be derived therefrom, a common selection of the address controls for DEA1 and DEA2 on the other hand, and of the pre-loading circuits 16 and 17, on the other hand, ensues, whereby the address controls 8 and 10 for DEA1 as well as 9 and 11 for DEA2 are activated in the first clock phase PH1 of $U_T$, whereas the pre-loading circuits 16 and 17 are simultaneously activated in the second clock phase PH2. The address controls of both inputs/outputs or both pre-loading circuits 16 and 17 are thereby respectively simultaneously activated. The advantage that derives is that the pre-loading phase PH2 can be made shorter than the addressing phase 1, so that the cycle time of the semiconductor memory determined by the clock period of the external clock voltage $U_T$ can be shortened in comparison to that required given a clock control of FIG. 3. Advantageous use possibilities occur in high-speed processors for such a semiconductor memory whose clock circuit operates in the latter operating mode, because of the shortening of the cycle time.

The conflict situations which derive when writing two different signals into one and the same memory cell simultaneously addressed via both inputs/outputs are suppressed in the above-described improvement of the invention when the clock circuit optionally works in the operating mode indicated by FIG. 4 because they are suppressed by logic gate circuits which prevent a simultaneous write-in of two different signals into the same memory cell.

In the operating mode of FIG. 4, the rising edges of the clock voltage $U_{V1}$ from the lower to the upper voltage value are advantageously delayed by the time spans indicated by the double arrows 30 and 31 in comparison to the preceding trailing edges 32 and 33 of $U_{V1}$. In an analogous fashion, the leading edges of $U_{V2}$ lie following the trailing edges 36 and 37 of $U_{D2}$ by the time spans 34 and 35. What is achieved thereby is that the address controls of the inputs/outputs are deactivated before the pre-loading of the data line pairs begins.

Figure 5:
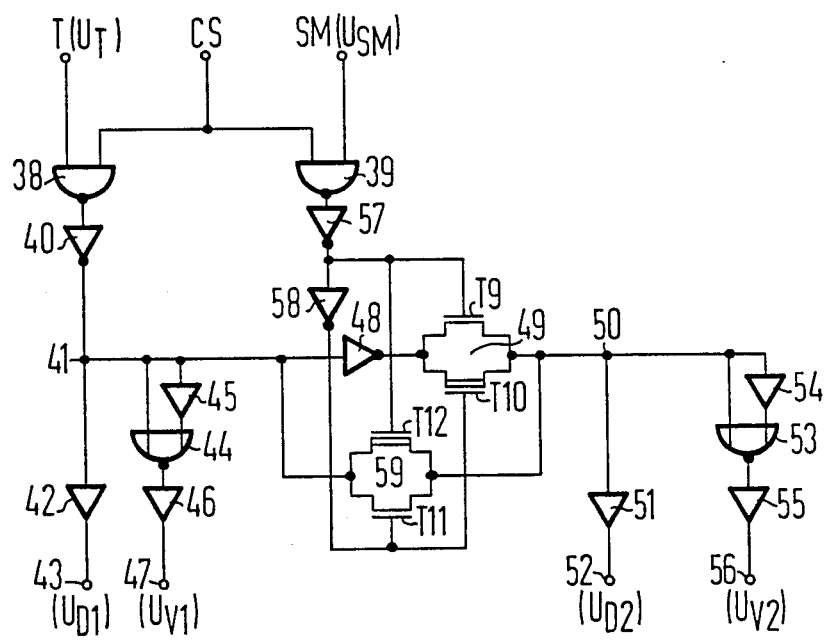
FIG. 5 shows a preferred exemplary embodiment of a subcircuit of FIG. 1.

A preferred embodiment of the clock circuit 20 is shown in FIG. 5. The clock circuit, in accord with the improvement of the invention, is optionally switchable to one of two operating modes. It contains two NAND gates 38, 39 whose first inputs T and SM respectively correspond to the inputs of FIG. 1 bearing the identical designations. The second inputs of 38 and 39 are connected to a terminal CS. The output of 38 is connected via an inverter 40 to a circuit node 41 which is in communication with an output 43 via an amplifier 42. The node 41 is directly wired, first, to the first input of an NOR gate 44 and to the second input thereof via an amplifier 45. The output of 44 is conducted via an amplifier 46 to an output 47. Further, the node 41 is connected via an inverter 48 and via a transmission gate 49 to a node 50 which is in turn in communication with an output 52 via an amplifier 51. The node 50 is directly connected to the first input of an NOR gate 53 and is also wired via an amplifier 54 to the second input of this gate, the output of which is applied to an output 56 via an amplifier 55.

The transmission gate 49 is composed of an n-channel transistor T9 and of a p-channel transistor T10 which respectively have their source-drain paths inserted between the output of the inverter 48 and the node 50. The gate terminal of T9 is connected to the output of an inverter 57 which follows the output of a NOR gate 39, whereas the gate terminal of T10 is connected to the output of an inverter 58 which follows the inverter 57. Finally, another transmission gate 59 is provided, this being formed of an n-channel transistor T11 and of a p-channel transistor T12 which have their source-drain paths inserted between the nodes 41 and 50. The gate terminal of T11 is connected to the output of the inverter 58; the gate terminal of T12 is connected to the output of the inverter 57.

Given the assumption that the terminal CS receives a logical "1" and a signal $U_{SM}$ is applied to the input SM which likewise corresponds to a logical "1", a logical "0" derives at the output of 39, a logical "1" is produced at the output of 57, and a logical "0" again is produced at the output of 58. As a result thereof, the transmission gate 49 is activated, whereas the transmission gate 59 remains inhibited. Every clock pulse of $U_T$ is transmitted to the output of the inverter 40 and, thus, to the output 43 noninverted, so the internal clock voltage $U_{D1}$ can be taken at the output 43. The inverse voltage of $U_{D1}$ is available at the output 47 as clock voltage $U_{V1}$. The time delays 22 and 23 arise due to the transit time of the amplifier 45. The inverter 48 causes a voltage inverse to $U_{D1}$ at the output 52, this representing the clock voltage $U_{D2}$. Finally, the clock voltage $U_{V2}$ can be taken at the output 56, with the delays 26 and 27 being caused to the transit time of the amplifier 54. The clock voltages of FIG. 3 are thus derived via the outputs 43, 47, 52 and 56.

When the signal $U_{SM}$ is then disconnected from the terminal SM or, respectively, when a "0" is adjacent at SM, then the transmission gate 59 becomes activated instead of 49, and the gate 49 is inhibited. The nodes 41 and 50 are thus connected to one another in conductive fashion, so that the clock voltages $U_{D2}$ and $U_{V2}$ each completely correspond to the clock voltages $U_{D1}$ and $U_{V1}$ in terms of their chronological course. The operating mode of the clock circuit 20 shown in FIG. 4 then results.

When a logical "0" is applied to the terminal CS, then, independently of the clock voltage $U_T$, respective "1" signals arise at the outputs 47 and 56 but "0" signals arise at the outputs 43 and 52, so that a pre-loading of all data line pairs $LP_{p1}$ and $LP_{p2}$ takes place.

A clock circuit 20, which operates only in the operating mode of FIG. 3, results from the circuit of FIG. 5 when the parts 39, 57, 58 and 59 are omitted and the transmission gate 49 is replaced by a conductive connection between the output of 48 and the node 50.

It will be apparent that various modifications and/or additions may be made in the apparatus of the invention without departing from the essential feature of novelty involved, which are intended to be defined and secured by the appended claims.

I claim:

1. In a semiconductor memory with random access via two separate input/output terminals for data (DEA1, DEA2), said memory having a plurality of memory cells interconnected by data lines, each of said input/output terminals having an address control (8, 10; 8,11) and a separate write-read path (12, 13) and means for charging said data lines (L, L1', L2, L2') connecting said individual memory cells with a prescribed potential, the combination comprising; a first pre-loading circuit (16) for connecting the data lines (l1, L1') allocated to the first input/output terminal (DEA1) to said prescribed potential and a second pre-loading circuit (17) for connecting the data lines (l2, L2') allocated to the second input/output terminal (DEA2) to said prescribed potential, a clock circuit (20) connected to receive a clock voltage ($U_T$) and to produce timing signals for the address controls (8, 10; 9, 11) and the pre-loading circuits (16, 17) so that the address control (8, 10) of the first input/output terminal (DEA1) and the pre-loading circuit (17) for the data lines (L2, L2) allocated to the second input/output terminal (DEA2) are activated during a first clock phase (PH1) and the address control (9, 11) of the second input/output terminal (DEA1) and the pre-loading circuit (16) for the data lines (L1 L1') allocated to the first input/output terminal (DEA1) are activated during a second clock phase (PH2).

2. The semiconductor memory according to claim 1, wherein the clock circuit (20) is selectively switchable to another operating mode in which said clock circuit provides timing signals for the address controls (8, 10, 9, 11) and the pre=loading circuits (16, 17) in common, so that the address controls (8, 10; 9, 11) of both input/output terminals (DEA1, DEA2) are activated during the first clock phase (PH1) and both pre-loading circuits (16, 17) are activated during the second clock phase (PH2).

3. The semiconductor memory according to claim 1 or 2, including an address decoder connected to the address control (8, 10) of an input/output terminal (DEA1), to select a read or write circuit in the allocated write-read path (12).

4. The semiconductor memory according to one of the claims 1 and 2, including delay elements (45, 54) for the pre-loading circuits (16, 17) arranged in series with the clock circuit outputs (47, 56), said delay elements initiating a delay (22) of the activation of a pre-loading circuit (16) following the preceding de-activation circuit )24) of the address control (8, 10) of the input/output terminal (DEA1) allocated thereto.

5. The semiconductor memory according to one of the claims 1 and 2, wherein said clock circuit (20) comprises two NAND gates (38, 39) whose first inputs (T,SM) are respectively wired to the clock voltage ($U_T$) and to a signal ($U_{SM}$) for operating mode switching and whose second inputs are connected to a common terminal (CS); a first inverter (40) for connecting the output of the one NAND gate (38) to a first circuit node (41) which is in communication with a first clock circuit output (43) via a first amplifier (42); means for connecting said first NOR gate (44) and to the to the first input of a first NOR gate (44) and to the connecting the output of the first NOR gate to a second clock circuit output (47) via a third amplifier (46); means for connecting the output of the other NAND gate (39) to a series circuit of a second and a third inverter (57, 58); means for connecting the first circuit node (41) to a second circuit node (50) via a fourth inverter (48) and via a first transmission gate (49); means for connecting the control inputs of the first transmission gate (49) to the outputs of the second and third inverters (57, 58); a second transmission gate (59) controlled by the outputs of the second and third inverters (57, 58), said second transmission gate connecting the first circuit node (41) to the second circuit node (50); means for connecting said second circuit node (50) with a third clock circuit output (52) via a fourth amplifier (51); means for connecting said second circuit node (50) directly to the first input of a second NOR gate (53) and to the second input thereof via a fifth amplifier (54); means for connecting the output of the second NOR gate (53) to a fourth circuit output (56) via a sixth amplifier (55); whereby respective clock voltages for the selection of the address control (8, 10; 9, 11) of the two input/output terminals (DEA1, DEA2) are produced at the first and third clock circuit outputs and respective clock voltages for the selection of the pre-loading circuits (16, 17) for the data lines (L1, L1', L2, L2') allocated to the input/output terminal (DEA1, DEA2) are produced at the second and fourth clock circuit outputs.

* * * * *